(12) United States Patent
Endo

(10) Patent No.: US 8,384,177 B2
(45) Date of Patent: Feb. 26, 2013

(54) SEMICONDUCTOR DEVICE AND METHOD OF MANUFACTURING A SEMICONDUCTOR DEVICE

(75) Inventor: Nobuyuki Endo, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 191 days.

(21) Appl. No.: 12/883,221

(22) Filed: Sep. 16, 2010

(65) Prior Publication Data

US 2011/0089513 A1    Apr. 21, 2011

(30) Foreign Application Priority Data

Oct. 16, 2009   (JP) .................... 2009-239867

(51) Int. Cl.
*H01L 31/04*   (2006.01)

(52) U.S. Cl. ........ 257/446; 257/510; 257/515; 257/519; 257/E31.11; 438/296

(58) Field of Classification Search ................ 257/446, 257/510, 515, 519, E31.11; 438/221, 296
See application file for complete search history.

(56) References Cited

U.S. PATENT DOCUMENTS

| | | | |
|---|---|---|---|
| 5,668,403 A | 9/1997 | Kunikiyo | 257/639 |
| 6,436,783 B1 | 8/2002 | Ono et al. | 438/366 |
| 2002/0022326 A1* | 2/2002 | Kunikiyo | 438/296 |
| 2003/0143810 A1* | 7/2003 | Kuroi et al. | 438/289 |
| 2004/0080018 A1* | 4/2004 | Kim et al. | 257/510 |
| 2005/0145902 A1* | 7/2005 | Mouli | 257/291 |
| 2006/0017132 A1* | 1/2006 | Birner et al. | 257/510 |
| 2010/0219501 A1* | 9/2010 | Sandhu et al. | 257/510 |

FOREIGN PATENT DOCUMENTS

| | | |
|---|---|---|
| JP | 8-046025 A | 2/1996 |
| JP | 8-316465 A | 11/1996 |
| JP | 2001-156291 A | 6/2001 |
| JP | 2004-356554 A | 12/2004 |

* cited by examiner

*Primary Examiner* — Allan R Wilson
(74) *Attorney, Agent, or Firm* — Fitzpatrick, Cella, Harper & Scinto

(57) ABSTRACT

A semiconductor device has an active region formed on a semiconductor substrate, a trench-type element isolation region formed on the semiconductor substrate, and a diffusion region in which fluorine is diffused that surrounds the element isolation region and is formed on the semiconductor substrate so as not to contact the active region.

5 Claims, 2 Drawing Sheets

SEMICONDUCTOR DEVICE AND METHOD OF MANUFACTURING A SEMICONDUCTOR DEVICE

BACKGROUND OF THE INVENTION

1. Field of the Invention

The present invention relates to a technique for terminating dangling bonds occurring in a trench-type element isolation region of a semiconductor device or image sensor.

2. Description of the Related Art

Solid-state image sensors, in which pixels including photoelectric conversion elements are arrayed in one or two dimensions, are mounted in electronic devices such as digital cameras, digital video cameras, copiers, and facsimile machines. Types of solid-state image sensors include, for example, CCD image sensors and CMOS-type image sensors.

Recently, with an increase in the number of pixels in solid-state image sensors, miniaturization of the pixels has proceeded apace and the light receiving area of the light receiving elements and the area of the active regions of the transistors that constitute a circuit continue to decrease. In CMOS-type image sensors in particular, because an element isolation region for isolating the light receiving element from the transistor and for isolating the transistors from each other is provided, the area of the element isolation region must be reduced to achieve miniaturization. As the signal load decreases with the miniaturization of the pixels, it becomes necessary to reduce also the dark current of the light receiving area that becomes a noise component.

To cope with such miniaturization, Shallow Trench Isolation (STI) has come to be employed, which involves filling the inside of a trench in the semiconductor substrate with insulating film as the element isolating region.

It is known that, compared to use of a selective oxide layer fabricated using the Local Oxidation of Silicon (LOCOS) method, use of an STI structure as the element isolation region in a semiconductor device causes more crystal defects adjacent to the element isolation region and, as a result, an increase in leakage current. It is known that the cause of this leakage current is high interface trap density resulting from many deformations and crystal defects remaining in the interface between the silicon and the silicon oxide film at the inner walls of the STI.

In Japanese Patent Laid-Open No. 08-316465, a method of implanting fluorine atoms in the interface between the silicon oxide layer and the silicon substrate and terminating dangling bonds with the fluorine to produce Si—F bonding thereby reducing the crystal defects is disclosed.

In addition, implanting fluorine ions before and after formation of the gate insulating film is known to adversely affect the device formation regions due to implantation damage and to invite a reduction in the reliability of the gate electrode and gate insulating film due to the mixing in of a large amount of fluorine (Japanese Patent Laid-Open No. 2004-356554, Japanese Patent Laid-Open No. 2001-156291).

However, when the interface trap reduction technique described in Japanese Patent Laid-Open No. 08-316465 is applied to solid-state image sensors, a problem arises in that photoelectric conversion element dark current (or leakage current) and dark current (or leakage current) in the trench-type element isolation region are not sufficiently reduced. With digital camera solid-state image sensors, it is necessary to keep the dark current on the order of femto amperes (fA) per pixel, which is a size that is far smaller than that allowed for CPU and other logic circuits or for memory devices. Thus, it is clear that the conventional technique must be improved in order to be used with solid-state image sensors.

In addition, as described in Japanese Patent Laid-Open No. 2004-356554 and Japanese Patent Laid-Open No. 2001-156291, implanting fluorine ions before and after formation of the gate insulating film is known to pose a risk of damaging the device formation regions. The active region of a solid-state image sensor has photoelectric conversion elements as well as MOS transistors, and for this reason damage to the gate oxide film must be kept to a minimum. Moreover, although the reliability of the oxide film is not a major problem in the element isolation region, due to miniaturization of the pixels it is necessary to keep crystal defects and interface traps in the element isolation region nearest the photoelectric conversion elements to a minimum.

SUMMARY OF THE INVENTION

The present invention has been made in consideration of the above situation, and suppresses occurrence of dark current in a trench-type element isolation region of a semiconductor device.

According to the present invention, provided is a semiconductor device comprising: an active region formed on a semiconductor substrate; a trench-type element isolation region formed on the semiconductor substrate; and a diffusion region in which fluorine is diffused that surrounds the element isolation region and is formed on the semiconductor substrate so as not to contact the active region.

According to the present invention, provided is a manufacturing method for a semiconductor device having an active region and an element isolation region formed on a semiconductor substrate, the manufacturing method comprising the steps of: forming a mask having an opening therein that forms the element isolation region on the semiconductor substrate; forming a trench in the semiconductor substrate through the opening; covering inner walls of the trench with an insulating film; implanting fluorine in the insulating film; forming a diffusion region that surrounds the element isolation region and does not contact the active region by diffusing the fluorine by annealing; and forming the trench-type element isolation region by filling the trench with insulating material.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings. The dimensions, materials, shapes and relative positions of the constituent parts shown in the embodiments should be changed as convenient depending on various conditions and on the structure of the apparatus adapted to the invention, and the invention is not limited to the embodiments described herein.

Figure 1:
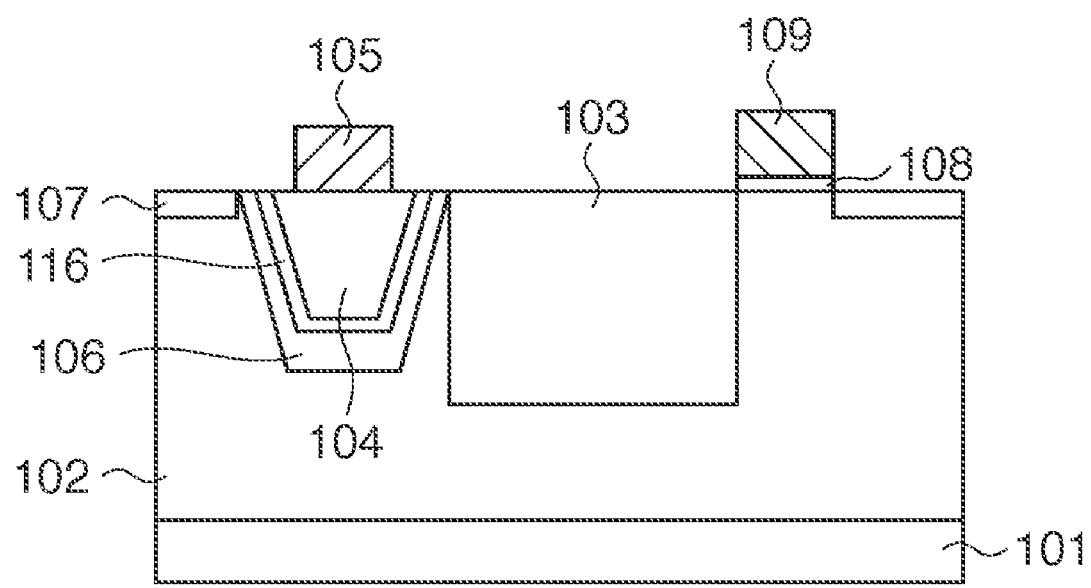
FIG. 1 is a cross-sectional diagram of a pixel portion of a solid-state image sensor according to an embodiment of the present invention.

FIG. 1 is a cross-sectional diagram of a pixel portion of a solid-state image sensor, which is one example of a semiconductor device of the present invention. In FIG. 1, 101 designates an N-type semiconductor substrate, 102 designates a P-type well region formed in the N-type semiconductor substrate, and 103 designates an N-type semiconductor region (photoelectric conversion region) of a photodiode that is a photoelectric conversion element. It is to be noted that, although not shown, in order to make the photodiode an embedded type it is also possible to form a heavily doped P-type layer on the uppermost surface of the N-type semiconductor region 103.

Reference numeral 104 designates a trench-type element isolation region constructed of insulating material for the purpose of electrically isolating adjacent active regions from each other, and 105 designates a polysilicon wiring layer. The polysilicon wiring layer 105 is not necessarily always located at the position shown, and FIG. 1 shows but one example. Reference numeral 106 designates a P-channel stop region and 116 designates a fluorine diffusion region. The fluorine diffusion region 116 is a portion between the P-channel stop region 106 and the element isolation region 104. More specifically, it is silicon in which dangling bonds have been terminated by fluorine.

Reference numeral 107 designates a MOS transistor source-drain region, 108 designates a gate oxide film, and 109 designates a gate electrode of the charge transfer MOS transistor, called a transfer gate.

As shown in FIG. 1, in the present embodiment the fluorine diffusion region 116 in which the fluorine is diffused is formed only in the silicon region that contacts the inner walls of the trench-type element isolation region 104. The fluorine diffusion region 116 is separated so that it does not contact either the N-type semiconductor region 103, which forms a photoelectric conversion device, or the source-drain region 107. In the present embodiment, further, the channel stop region 106 is disposed between the fluorine diffusion region 116 and the N-type semiconductor region 103 or the source-drain region 107. With this structure, dark current arising from the vicinity of the element isolation region 104 can be kept to a minimum while the effects of implant damage and the adverse impact on the photoelectric conversion elements or the gate oxide film 108 of mixing in much fluorine can be minimized.

FIGS. 2A-2G are diagrams showing steps in a process of forming the fluorine diffusion region in the solid-state image sensor shown in FIG. 1. It is to be noted that, although the solid-state image sensor manufacturing method according to the present embodiment is a method that is applied to solid-state image sensors that form the element isolation region using the STI technique seen in amplified MOS sensors, its distinctive feature is in the step of fabricating the element isolation region. Fabrication processes that are the same as those of existing semiconductor manufacturing steps can be used for steps other than the fabrication of the element isolation region, and therefore a description thereof is omitted here.

Figure 2A:
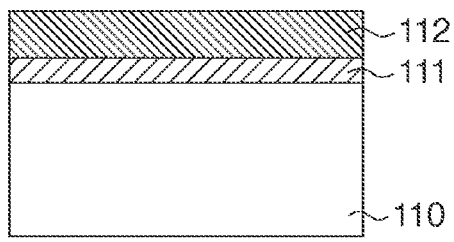
FIGS. 2A-2G are diagrams showing steps in a process of forming a diffusion region in which fluorine is diffused in the solid-state image sensor shown in FIG. 1.

First, a silicon oxide film 111 of about 10-20 nm and a silicon nitride film 112 of about 150-200 nm are formed in that order on the silicon substrate 110 (FIG. 2A). Next, a photoresist 113 in which only the regions that form the element isolation region 104 are open is formed. This photoresist 113 is used as a mask for etching the silicon nitride film 112 (FIG. 2B). Then, the photoresist 113 is removed, the silicon oxide film 111 and the semiconductor silicon substrate 110 are subjected to dry etching using the silicon nitride film 112 as a mask to form a trench 114 (FIG. 2C). The process up to this point is the same as known trench fabricate method. The depth of the trench 114 formed by etching is about 250 nm to 350 nm. Crystal defects 119 appear adjacent to the side walls of the trench 114 in the silicon substrate 110 due to the effects of damage from this dry etching.

Figure 2E:
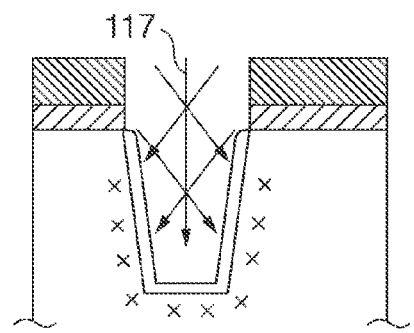
Figure 2B:
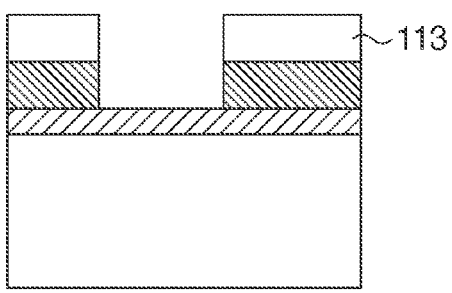
Figure 2F:
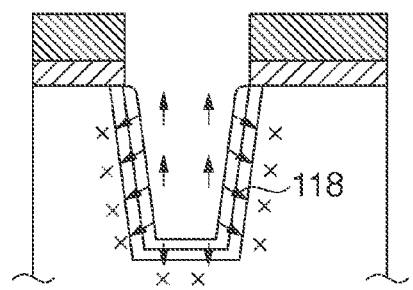
Figure 2C:
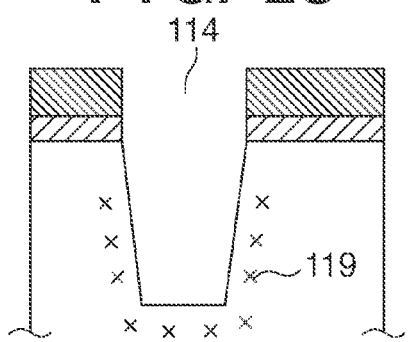
Figure 2G:
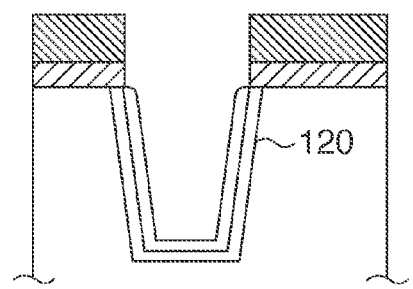
Figure 2D:
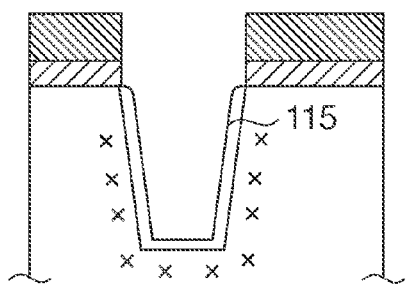

After forming the trench 114, a silicon oxide film 115 as an insulating film is formed so as to uniformly cover the inner wall surfaces, that is, the bottom and side surfaces, of the trench 114 (FIG. 2D). The thickness of this inner wall silicon oxide film 115 is about 30-40 nm.

Subsequently, fluorine ions 117 are implanted uniformly throughout the inner wall silicon oxide film 115 using an ion implantation device (FIG. 2E). Implantation is carried out at an implant angle having an angle that is slanted with respect to the top surface of the silicon substrate. Here, it is sufficient to inject ions containing at least fluorine, and therefore implantation may be carried out using a compound such as BF2 ion or the like. In the fluorine implantation step, implantation damage occurs if the implanted fluorine penetrates the inner wall silicon oxide film 115 and reaches the silicon substrate 110 directly, causing crystal defects adjacent to the side walls of the trench to increase further. For this reason, the acceleration energy is kept at 5-6 KeV, for example, enough to implant the fluorine in the inner wall silicon oxide film 115 without reaching the silicon substrate 110. The fluorine has the effect of reducing dangling bonds in proportion to the amount implanted, and therefore the amount implanted is $1 \times 10^{11}$ cm$^{-2}$ or more, which is the limit for a typical medium current ion implantation device.

Next, annealing is carried out to diffuse the fluorine in the inner wall silicon oxide film 115 to enable the fluorine to fully terminate the crystal defects 119 present adjacent to the trench side walls (118). Such annealing is carried out at a temperature of 800°-1000° C., for example (FIG. 2F). Annealing causes the diffused fluorine to react with the dangling bonds and produce Si—F bonds, terminating the dangling bonds with fluorine as a result. The upshot is that crystal defects adjacent to the trench side walls are reduced. Moreover, excess fluorine that does not contribute to the reaction are diffused outwards and disappear, leaving no excess fluorine residue. In this manner, a fluorine diffusion region 120 is formed in the silicon substrate 110 adjacent to the trench side walls (FIG. 2G).

Subsequently, the P-channel stop region 106 is formed by carrying out ion implantation using more energy than when injecting fluorine ions. Next, the inner sides of the inner wall silicon oxide film 115 are covered with insulating material. Since this and subsequent steps are the same as known trench-type element isolation region formation steps a description thereof is omitted.

Thus, as described above, according to the present embodiment, with the process of forming the fluorine diffusion region 120 described above, dangling bonds at the side walls of the trench 114 can be terminated using fluorine, which has a higher bonding energy than hydrogen. As a result, even after annealing due to follow-on process changes, leaving of fluorine can be suppressed. In addition, since fluorine ions are implanted in the inner wall silicon oxide film 115, damage to the silicon-silicon oxide film interface due to implantation is minimal. Therefore, the occurrence of dark current in the trench-type element isolation region can be suppressed.

It is to be noted that prior to the fluorine ion implantation process shown in FIG. 2E, a film that is thicker than the inner wall silicon oxide film 115 is formed on the active region on which photoelectric conversion element is formed. In the example shown in FIGS. 2A-2G, the silicon nitride film 112 thicker than the inner wall silicon oxide film 115 is formed. The silicon nitride film has a high diffusion protecting effect. Thus, by forming the silicon nitride film 112 thicker than the inner wall silicon oxide film 115, diffusion of the fluorine onto the active region can be fully suppressed. Moreover, suppressing diffusion of the fluorine to the active region not only enhances the reliability of the gate electrode and in the gate insulating film but also, when caring out silicidification, prevents the top surface of the silicide from acquiring a high resistance.

By arranging multiple photoelectric conversion elements configured as described above in one or two dimensions, an image sensor such as a line sensor or an area sensor can be constructed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-239867, filed on Oct. 16, 2009, which is hereby incorporated by reference herein its entirety.

What is claimed is:

1. A semiconductor device comprising:
   an active region having an element including a photoelectric conversion region formed in a semiconductor substrate, and said semiconductor substrate having a trench formed in said substrate;
   a trench-type element isolation region, formed within said trench, configured to electrically isolate said active region;
   a fluorine diffusion region constituting an inner wall of said trench, formed by diffusing fluorine in said semiconductor substrate and arranged between said trench-type element isolation region and said semiconductor region of said element; and
   a channel-stop region formed around said fluorine diffusion region in said semiconductor substrate and between said photoelectric conversion region and said fluorine diffusion region.

2. The semiconductor device according to claim 1, wherein said fluorine diffusion region is arranged apart from said photoelectric conversion region.

3. The semiconductor device according to claim 1, wherein said active region has additional circuitry including a transistor.

4. The semiconductor device according to claim 3, wherein said element undergoes silicidation.

5. The semiconductor device according to claim 3, wherein said trench-type element isolation region has a depth of about 250 nm to 350 nm.

* * * * *